(12) United States Patent
Barrow

(10) Patent No.: US 9,520,965 B2
(45) Date of Patent: Dec. 13, 2016

(54) MONITORING AND CONTROL OF REFERENCE CLOCKS TO REDUCE BIT ERROR RATIO

(71) Applicant: Shawn Barrow, Suwanee, GA (US)

(72) Inventor: Shawn Barrow, Suwanee, GA (US)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 14/587,477

(22) Filed: Dec. 31, 2014

(65) Prior Publication Data
US 2016/0191202 A1 Jun. 30, 2016

(51) Int. Cl.
| | | |
|---|---|---|
| H04L 7/00 | (2006.01) | |
| H04L 7/02 | (2006.01) | |
| H04L 25/38 | (2006.01) | |
| H04L 1/00 | (2006.01) | |
| H04L 7/033 | (2006.01) | |

(Continued)

(52) U.S. Cl.
CPC ............ *H04L 1/0036* (2013.01); *H03L 7/091* (2013.01); *H03M 1/0639* (2013.01); *H04L 1/0046* (2013.01); *H04L 1/20* (2013.01); *H04L 7/0054* (2013.01); *H04L 7/0087* (2013.01); *H04L 7/033* (2013.01); *H04L 7/0331* (2013.01)

(58) Field of Classification Search
CPC .... H04L 27/2601; H04L 27/2657; H04L 7/00; H04L 7/0334; H04L 7/0338; H04L 7/04; H04L 7/0337; H04L 7/0025; H04L 7/033; H04L 1/20; H04L 7/0008; H04L 7/0029; H04L 7/0331; H04L 1/205; H04L 27/066; H04L 7/0083; H03M 1/0836; H04B 3/462; G11B 7/0906; G11C 7/222; G11C 2207/2254; G01R 31/31709; H03L 7/095; H03L 7/0991; H03L 7/0992; H03L 7/0996; H03L 7/0998; H03L 7/18; H03L 7/193; H03L 7/199; H03L 7/23; H03L 7/0818; H03L 7/091; H03L 7/093; H03L 7/081; H03L 7/085; H03L 7/089; H03L 2207/06; H03L 2207/50; H03L 7/00; H03L 7/0802; H03L 7/0805; H03L 7/087; H03L 7/197; H03L 7/08; H03L 7/0814; H03L 7/0816; G06F 1/10; G06F 1/08; G06F 1/12
USPC .............. 370/219, 220, 222, 240.26–240.28, 252,370/259, 278, 284, 285, 293, 294, 295, 302,370/306, 307, 303, 304, 316, 322, 338, 339,370/340, 344, 345, 346, 347, 354, 358, 362,370/364, 365, 371, 373, 374, 375, 376, 370, 359
See application file for complete search history.

(56) References Cited

U.S. PATENT DOCUMENTS

| | | | |
|---|---|---|---|
| 5,825,253 A | * | 10/1998 | Mathe ...................... H03L 7/183 327/115 |
| 7,501,865 B1 | | 3/2009 | Jacobowitz et al. |

(Continued)

OTHER PUBLICATIONS

Extended European Search Report in corresponding European Application No. 15202484.0-1851 dated Mar. 23, 2016 (6 pages).

*Primary Examiner* — Linda Wong
(74) *Attorney, Agent, or Firm* — Osha Liang LLP

(57) ABSTRACT

A method for reducing a frequency error, including: applying a plurality of dither values to a local reference clock over a first time interval; sampling, during the first time interval and using the local reference clock, a first plurality of data values received over an asynchronous link, where the first plurality of data values are transmitted over the asynchronous link based on a remote reference clock; tracking a plurality of errors from sampling the first plurality of data (Continued)

values; and adjusting, based on the plurality of errors, a frequency of the local reference clock to reduce the frequency error between the local reference clock and the remote reference clock.

18 Claims, 7 Drawing Sheets

(51) Int. Cl.
  *H04L 1/20* (2006.01)
  *H03L 7/091* (2006.01)
  *H03M 1/06* (2006.01)

(56) References Cited

U.S. PATENT DOCUMENTS

| | | | |
|---|---|---|---|
| 8,385,394 B2* | 2/2013 | Kam | G01R 29/26 |
| | | | 375/226 |
| 2003/0223466 A1* | 12/2003 | Noronha, Jr. | H04N 21/226 |
| | | | 370/537 |
| 2008/0212729 A1* | 9/2008 | Shaanan | H04L 7/0054 |
| | | | 375/376 |
| 2008/0315928 A1 | 12/2008 | Waheed et al. | |
| 2009/0074127 A1* | 3/2009 | Liu | H03L 7/087 |
| | | | 375/376 |
| 2010/0246739 A1* | 9/2010 | Lou | H03L 7/08 |
| | | | 375/376 |
| 2011/0131439 A1* | 6/2011 | Renner | G06F 1/08 |
| | | | 713/401 |
| 2013/0216014 A1 | 8/2013 | Kong et al. | |

* cited by examiner

MONITORING AND CONTROL OF REFERENCE CLOCKS TO REDUCE BIT ERROR RATIO

BACKGROUND

In asynchronous bidirectional communication links, the local transceiver has its own local reference clock and the remote transceiver has its own remote reference clock. The local reference clock may be used by both the transmitter circuitry of the local transceiver and the receiver circuitry of the local transceiver. As the local reference clock and the remote reference clock each have their own crystal, the local reference clock and the remote reference clock run at different rates due to the differences in the two crystals. These differences may be exacerbated by crystal aging. If the two crystals drift apart from each other, the difference in frequency between the local reference clock and the remote reference clock (i.e., frequency error) will increase the bit errors (and thus the bit error ratio (BER)) on the received link. This frequency error impairment is in addition to the transmission line loss, dispersion, crosstalk, and other physical impairments that are present in communication links with high data rates and long electrical distances.

SUMMARY

In general, in one aspect, the invention relates to a method for reducing a frequency error. The method comprises: applying a plurality of dither values to a local reference clock over a first time interval; sampling, during the first time interval and using the local reference clock, a first plurality of data values received over an asynchronous link, wherein the first plurality of data values are transmitted over the asynchronous link based on a remote reference clock; tracking a plurality of errors from sampling the first plurality of data values; and adjusting, based on the plurality of errors, a frequency of the local reference clock to reduce the frequency error between the local reference clock and the remote reference clock.

In general, in one aspect, the invention relates to a non-transitory computer readable medium (CRM) storing instructions for reducing a frequency error. The instructions comprise functionality for: applying a plurality of dither values to a local reference clock over a first time interval; tracking a plurality of errors from sampling a first plurality of data values received over an asynchronous link, wherein the first plurality of data values are sampled during the first time interval using the local clock reference, and wherein the first plurality of data values are transmitted over the asynchronous link based on a remote reference clock; and adjusting, based on the plurality of errors, a frequency of the local reference clock to reduce the frequency error between the local reference clock and the remote reference clock.

In general, in one aspect, the invention relates to a system for reducing a frequency error. The system comprises: a local reference clock; a clock and data recovery (CDR) unit configured to sample, using the local reference clock, a plurality of data values during a first time interval, wherein the first plurality of data values are received over an asynchronous link, and wherein the first plurality of data values are transmitted over the asynchronous link based on a remote reference clock; and an error monitoring and frequency control (EMFC) unit configured to: apply a plurality of dither values to the local reference clock over the first time interval, track a plurality of errors from sampling the first plurality of data values, and adjust, based on the plurality of errors, a frequency of the local reference clock to reduce the frequency error between the local reference clock and the remote reference clock.

Other aspects of the invention will be apparent from the following description and the appended claims.

DETAILED DESCRIPTION

Figure 1A:
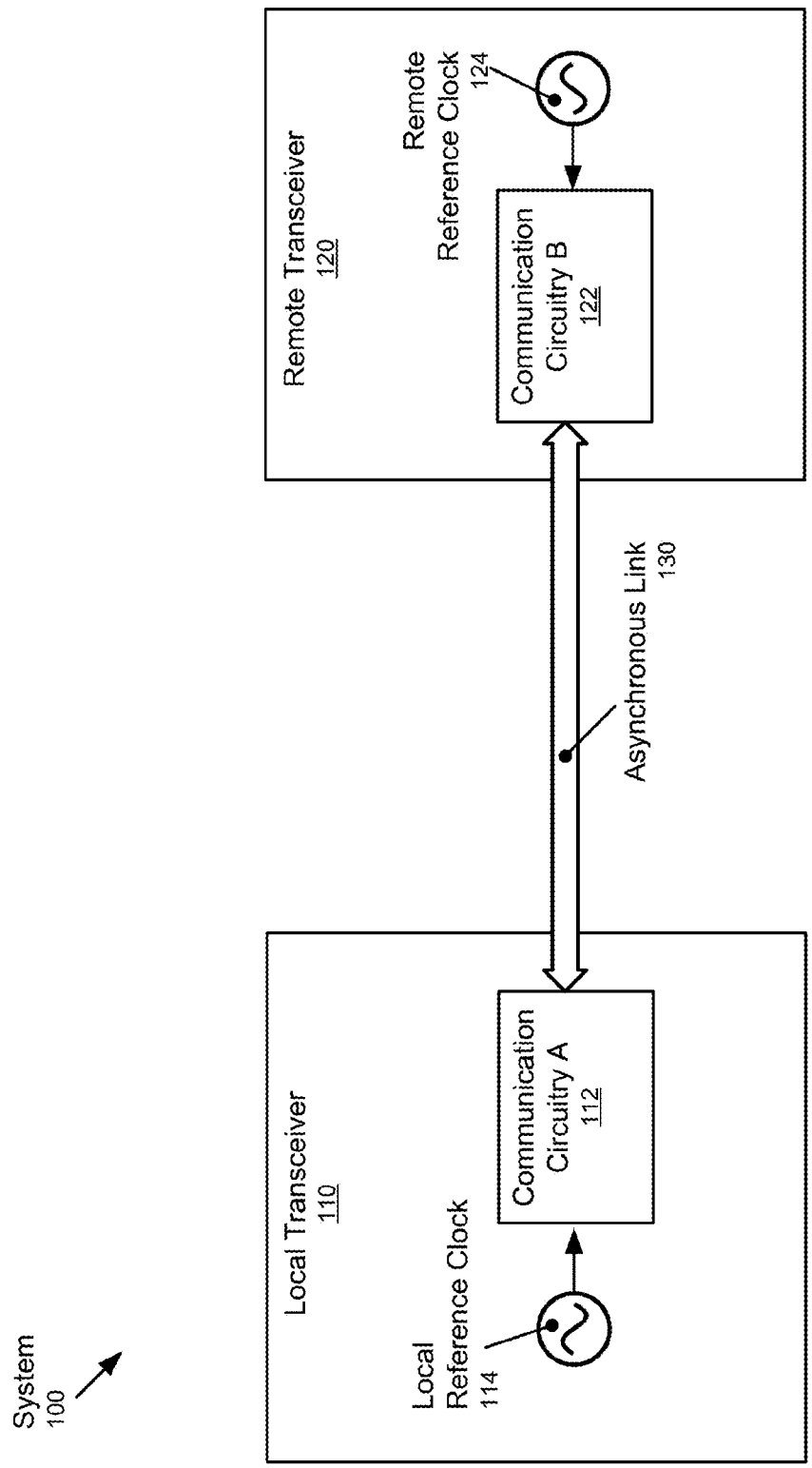
FIG. 1A depicts a block diagram of a system in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention provide a system, a method, and a computer readable medium (CRM) for reducing frequency error. Specifically, multiple dither values are applied to a local reference clock over a time interval. During the time interval, while the multiple dither values are being applied, the local reference clock is used to sample data values (e.g., a bit sequence) received over an asynchronous link. The data values were transmitted over the asynchronous link according to a remote reference clock. The probability of errors (e.g., bit errors) from sampling the data values increases as the frequency error (i.e., difference in frequencies) between the local reference clock and the remote reference clock increases. Accordingly, a different number of bit errors is likely to be observed during each half of the time interval because the applied dither values are effectively changing the frequency error during the time interval. The frequency of the local reference clock may be adjusted based on the observed bit errors (or BER) to reduce the frequency error. This process may be repeated until either (i) the total number of bit errors observed during a time interval is below a threshold; or (ii) the same or approximately the same number of errors are observed during both halves of the time interval. Moreover, large changes and/or multiple changes to the frequency of the local reference clock may also indicate that the crystal in the local reference clock and/or the crystal in the remote reference clock has failed.

FIG. 1 depicts a system (100) in accordance with one or more embodiments of the invention. As shown in FIG. 1, the system (100) may have multiple components including a local transceiver (110) and a remote transceiver (120) connected by a bidirectional asynchronous link (130). The local transceiver (110) includes a local reference clock (114) connected to communication circuitry A (112), while the remote transceiver (120) includes a remote reference clock (124) connected to communication circuitry B (122). The local transceiver (110) and the remote transceiver (120) may be in the same computing/hardware device or in different devices separated by any amount of distance. In one or more embodiments of the invention, the local transceiver (110) corresponds to a line module of a telecommunications system, while the remote transceiver (120) corresponds to a switch module of the telecommunication system.

Figure 3:
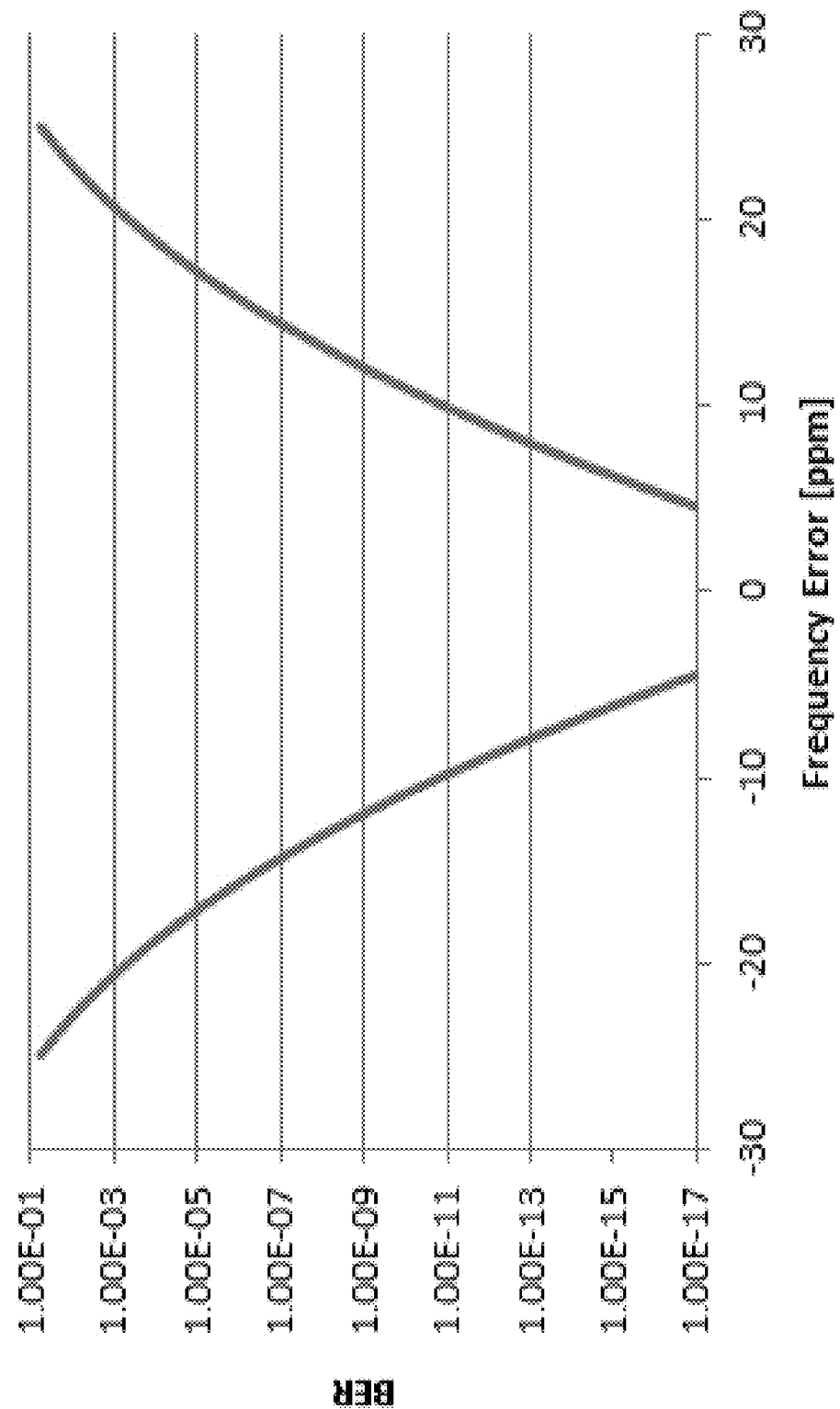
FIG. 3 shows a graph relating BER with frequency error in accordance with one or more embodiments of the invention.

In one or more embodiments of the invention, communication circuitry B (122) transmits data values over asynchronous link (130) according to the remote reference clock (124). Communication circuitry A (112) samples the data values received over the asynchronous link (130) using the local reference clock (114) (discussed below). As the local reference clock (114) and the remote reference clock (124) have different crystals, it is highly likely that the actual frequencies of the local reference clock (114) and the remote reference clock (124) are different. As discussed above, this non-zero difference is the frequency error between the local reference clock (114) and the remote reference clock (124). The frequency error may change over time as the crystals age. As also discussed above, an increase in the frequency error increases the probability of bit errors (and the BER) from sampling the data values. In fact, FIG. 3 shows a graph relating BER with frequency error in accordance with one or more embodiments of the invention. As shown in FIG. 3, as the frequency error approaches zero, the BER decreases. However, as the absolute value of the frequency error increases, the BER increases.

Although FIG. 1 shows a single local transceiver (110) and a single remote transceiver (120), in other embodiments of the invention, the system (100) has multiple local transceivers and multiple remote transceivers. Each of the local transceivers may correspond to line modules, while each of the remote transceivers may correspond to switch modules. Each of the local transceivers may be connected to each of the remote transceivers by a bidirectional asynchronous link.

Further, although FIG. 1 shows two transceivers (110, 120), in other embodiments of the invention, remote transceiver (120) is only a transmitter (i.e., no receiving capabilities) while local transceiver (110) is only a receiver (i.e., no transmitting capabilities). In such embodiments, the asynchronous link (130) may be unidirectional from the remote transceiver (120) to the local transceiver (110).

Figure 1B:
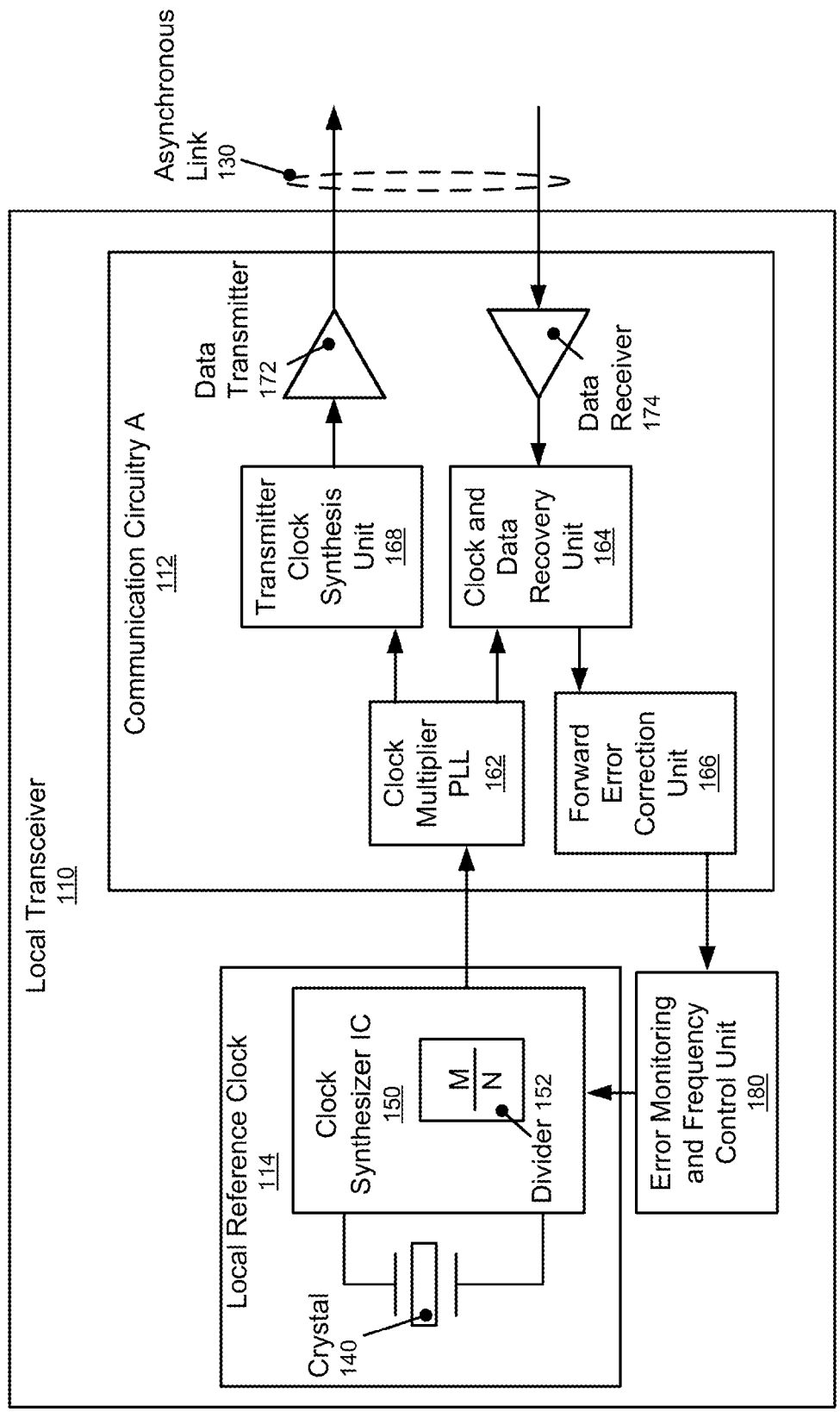
FIG. 1B depicts a block diagram of a transceiver in accordance with one or more embodiments of the invention.

FIG. 1B depicts a block diagram of the local transceiver (110) in accordance with one or more embodiments of the invention. As shown in FIG. 1B, the local transceiver (110) has multiple components including the local reference clock (114), communication circuitry A (112), and an error monitoring and frequency control (EMFC) unit (180). Although FIG. 1B shows the EMFC unit (180) as being external to communication circuitry A (112), in other embodiments of the invention, the EMFC unit (180) is part of communication circuitry A (112). Communication circuitry A (112) is connected to the bidirectional asynchronous link (130).

In one or more embodiments of the invention, the local reference clock (114) includes a crystal (140) connected to a clock synthesizer integrated circuit (IC) (150). The clock synthesizer IC (150) has very low jitter performance and allows for extremely fine tuning of the output frequency. Through the use of the high resolution dividers (152), extremely precise numerator and denominator values (M/N) can be applied to define an input to output frequency ratio. In fact, the clock synthesizer IC (150) is capable of adjusting its output frequency in steps below 50 parts per trillion (PPT) for standard reference clock frequencies in the range of hundreds of megaHertz (MHz).

In one or more embodiments of the invention, communication circuitry A (112) includes a clock multiplier phase lock loop (PLL) (162), a clock and data recovery (CDR) unit (164), a forward error correction (FEC) unit (166), a transmitter clock synthesis unit (168), a data transmitter (172), and a data receiver (174). Each of these components may be any combination of hardware and software. Each of these components is discussed below.

In one or more embodiments of the invention, communication circuitry A (112) includes the clock multiplier PLL (162). The clock multiplier PLL (162) fans out (i.e., distributes) the local reference clock (114) to other components in communication circuitry A (112). For example, the clock multiplier PLL (162) fans out the local reference clock (114) to both the transmitter clock synthesis unit (168) and the CDR unit (164).

In one or more embodiments of the invention, communication circuitry A (112) includes the data transmitter (172) and the data receiver (174). The data transmitter (172) and the data receiver (174) are the physical connections between communication circuitry A (112) and the asynchronous link (130). Accordingly, the data transmitter (172) and the data receiver (174) have the necessarily electrical properties and functionality to drive signals onto the asynchronous link (130) and receive signals from the asynchronous link (130), respectively. Moreover, the transmitter clock synthesis unit (168) is configured to generate a reference clock for the transmission of data values over the asynchronous link (130).

In one or more embodiments of the invention, communication circuitry A (112) includes the CDR unit (164). As shown in FIG. 1B, the CDR unit (164) inputs both the local reference clock (114), via the clock multiplier PLL (162), and the data values received over the asynchronous link (130). The CDR unit (164) is configured to sample the data values using the local reference clock (114). Specifically, the CDR unit (164) may include a variable frequency oscillator (VFO) (not shown) and a sampler (not shown). The CDR unit (164) is configured to recover the line rate (i.e., frequency of the remote reference clock (124)) from the received data values using the local reference clock, and then lock the VFO to this line rate. The VFO is then used to clock the sampler, which samples the received data values. If there is a significant difference between the line rate and the frequency of the local reference clock (i.e., significant frequency error), the phase noise of the VFO will be degraded. As the VFO derived clock quality degrades, the probability of a bit error (and thus the BER) increases due to an increased difference between the actual and ideal sampling points.

In one or more embodiments of the invention, communication circuitry A (112) includes the FEC unit (166). The FEC unit (166) is configured to detect, and in some cases correct, errors from sampling the data values. The FEC unit (166) may also be configured to report error statistics. Specifically, the FEC unit (166) may report an error as soon as it is detected. Additionally or alternatively, the FEC unit (166) may report errors in batches.

In one or more embodiments of the invention, the local transceiver (110) includes the EMFC unit (180). The EMFC unit (180) is configured to apply multiple dither values to the local reference clock (114) over a time interval. The dither values are small offsets to the frequency of the local reference clock (114). In one or more embodiments of the invention, a set of positive dither values are applied during one half of the time interval, while a set of negative dither values are applied to the other half of the time interval. Consecutive dither values have a step size of 100 parts per billion (PPB). This fine of a step size is imperceptible to the clock multiplier PLL (162). In one or more embodiments of the invention, the dither values form a wave during the time interval, such as a triangle wave, sine wave, etc.

Figure 4:
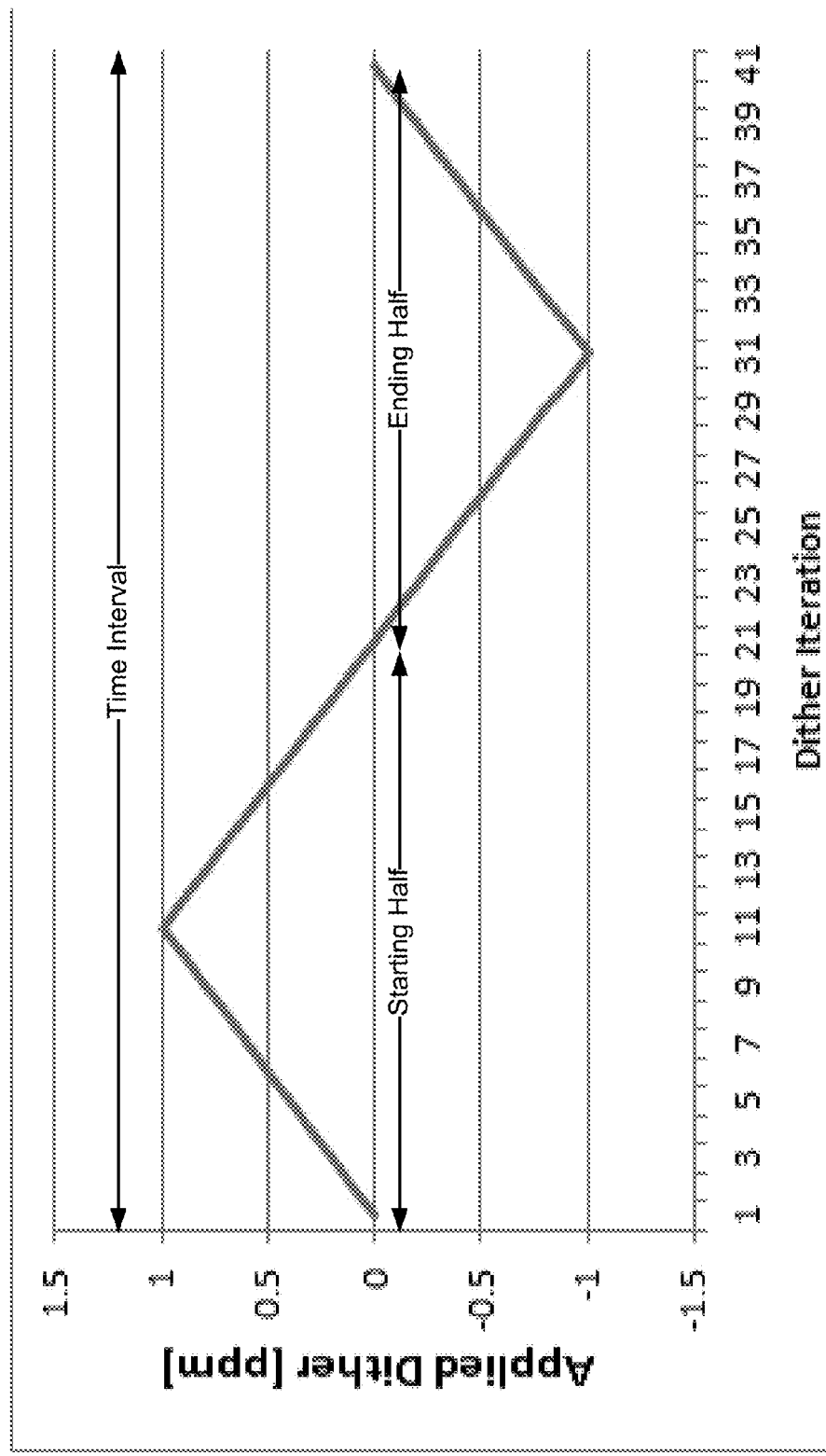
FIG. 4 shows a graph relating applied dither values over a time interval in accordance with one or more embodiments of the invention.

FIG. 4 is a graph showing applied dither values over a time interval. As shown in FIG. 4, during the starting half of the time interval, a set of positive dither values are applied. In contrast, during the ending half of the time interval, a set of negative dither values are applied. Alternatively, negative dither values may be applied during the starting half of the time interval, and positive dither values may be applied during the ending half. In FIG. 4, the largest applied dither value is +1.0 PPM and the smallest applied dither value is −1.0 PPM. Moreover, as shown in FIG. 4, the applied dither values may form a triangle wave.

Referring back to FIG. 1B, in one or more embodiments of the invention, the EMFC unit (180) applies the dither values using the divider (152). Specifically, the numerator (M) and/or the denominator (N) may be modified to apply the dither values. Those skilled in the art, having the benefit of this detailed description, will appreciate that by applying dither values to the local reference clock (114), the frequency error between the reference clock (114) and the remote reference clock (124) changes. This in turn changes the sampling points of the CDR unit (164), and thus may change the probability of errors from sampling the received data values.

In one or more embodiments of the invention, the EMFC unit (180) is configured to track errors. Specifically, the EMFC unit (180) may track errors reported by the FEC unit (166). The EMFC unit (180) may count the total number of errors reported during the time interval. The EMFC unit (180) may also count the number of errors from each of the starting half and the ending half of the time interval. These two error counts (i.e., error count from starting half, error count from ending half) may be compared and used to determine the sign (+/−) of the frequency error, and thus the direction in which to adjust the frequency of the lock reference clock to reduce the frequency error.

For example, if the error count is smaller for the half time interval during which the negative dither values are being applied, the frequency error is positive, and the frequency of the local reference clock (114) may be slowly decreased (e.g., by 1.0 PPM) to reduce the frequency error. This frequency change may be executed by adjusting the numerator and/or the denominator of the divider(s) (152).

As another example, if the error count is smaller for the half time interval during which the positive dither values are being applied, the frequency error is negative, and the frequency of the local reference clock may be slowly increased (e.g., by 1.0 PPM) to reduce the frequency error. This frequency change may be executed by adjusting the numerator and/or the denominator of the divider(s) (152).

In one or more embodiments of the invention, this process is repeated for multiple time intervals until either (i) the total number of bit errors observed during a time interval is below a threshold; or (ii) the same or approximately the same number of errors are observed during both halves of the time interval (i.e., the errors are balanced). In one or more embodiments, many changes and/or large changes to the frequency of the local reference clock (114) indicates that the crystal (140) in the local reference clock (140) has failed or is failing. Additionally or alternatively, many changes and/or large changes to the frequency of the local reference clock (114) indicates that the crystal (not shown) in the remote reference clock (124) has failed or is failing (discussed below). The EMFC unit (180) may be configured to issue an alert to an operator/administrator in response to the indication of failure.

Figure 1C:
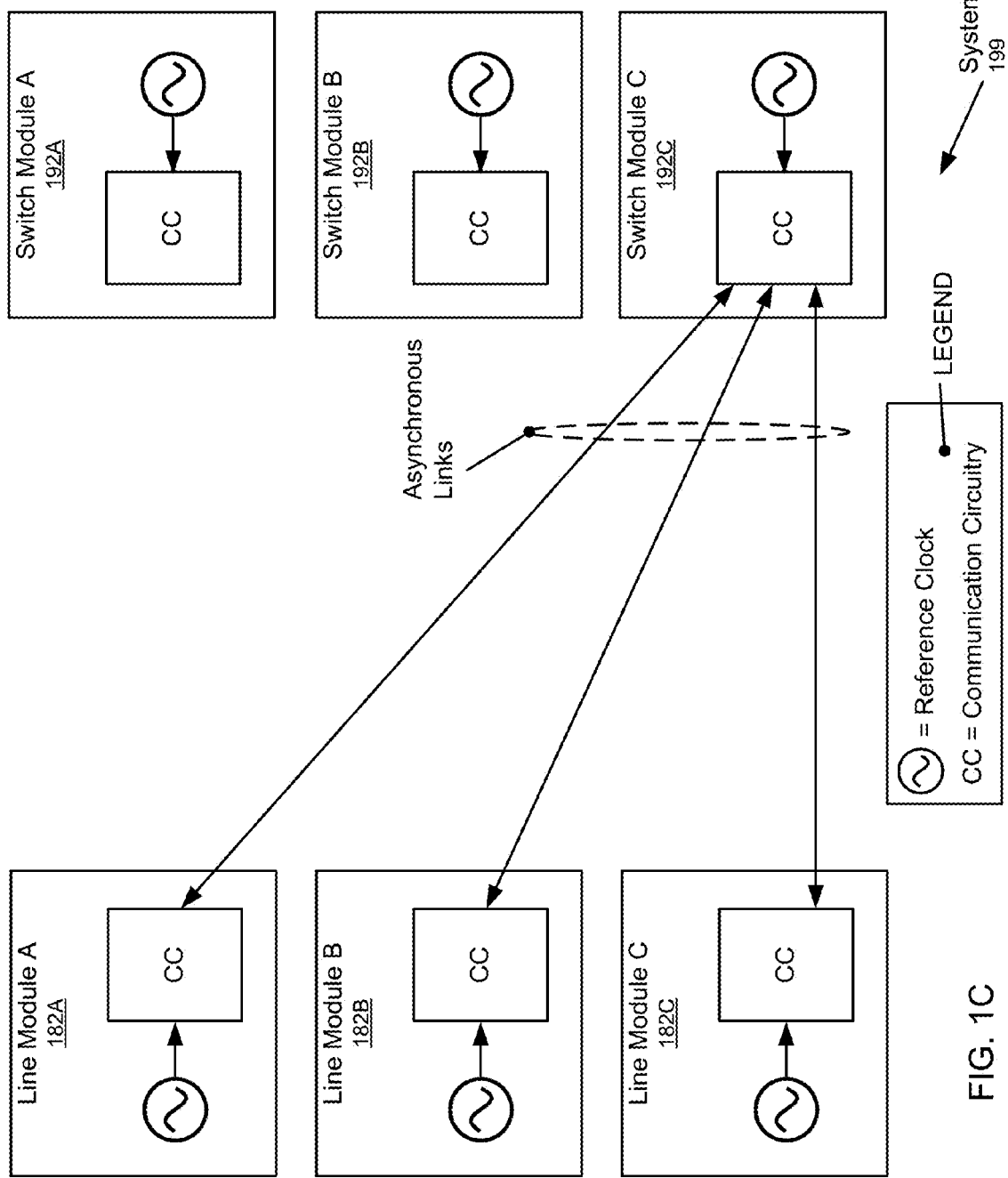
FIG. 1C depicts a block diagram of a system in accordance with one or more embodiments of the invention.

FIG. 1C shows a system (199) in accordance with one or more embodiments of the invention. As shown in FIG. 1C, the system (199) includes multiple line modules (i.e., line module A (182A), line module B (182B), line module C (182C)) and multiple switch modules (i.e., switch module A (192A), switch module B (192B), and switch module C (192C)). Each line module (182A, 182B, 182C) may correspond to local transceiver (110), discussed above in reference to FIG. 1A and FIG. 1B. Each switch module (192A, 192B, 192C) may correspond to remote transceiver (120), discussed above in reference to FIG. 1A. In one or more embodiments of the invention, a bidirectional asynchronous link (e.g., asynchronous link (130)) exists between each line module (182A, 182B, 182C) and each switch module (192A, 192B, 192C). However, only a subset of these asynchronous links are shown in FIG. 1C.

Now assume that many changes and/or large changes are being made to the local reference clock of line module C (182C). This is an indication that either: (i) the crystal in the local reference clock of line module C (182C) has failed; or (ii) the crystal in the remote reference clock of switch module C (192C) has failed. In other words, it is difficult to tell which of the two crystals has failed solely based on the large changes being made to the local reference clock of line module C (182C). Now assume that many changes are also being made to the local reference clock of line module B (182B) and the local reference clock of line module A (182A). In other words, large changes are being made to the local reference clocks of all three line modules (182A, 182B, 182C). As the likelihood of multiple crystals simultaneously failing is low, these large changes to the local reference clocks of all three line modules (182A, 182B, 182C) indicate that it is the crystal in the remote reference clock of switch module C (192C) that has failed. Alternatively, if largest changes were only being made to the local reference clock of line module C (182C) (i.e., no changes or small changes were being made to the local reference clocks of the other line modules (182A, 182B)), that would indicate that it is the crystal in the local reference clock of line module C (182C) that has failed.

Those skilled in the art, having the benefit of this detailed description, will appreciate that a voting mechanism may be implemented in the system (199) to determine which reference clock has the failed crystal. Specifically, each line module (182A, 182B, 182C) may issue an alert when there are large changes or many changes to its local reference clock. Similarly, no alerts are issued by a line module when there are no or small changes to its local reference clock. These alerts (and lack of alerts) may be tabulated and used to identify the local or remote reference clock with the failed crystal.

Figure 2:
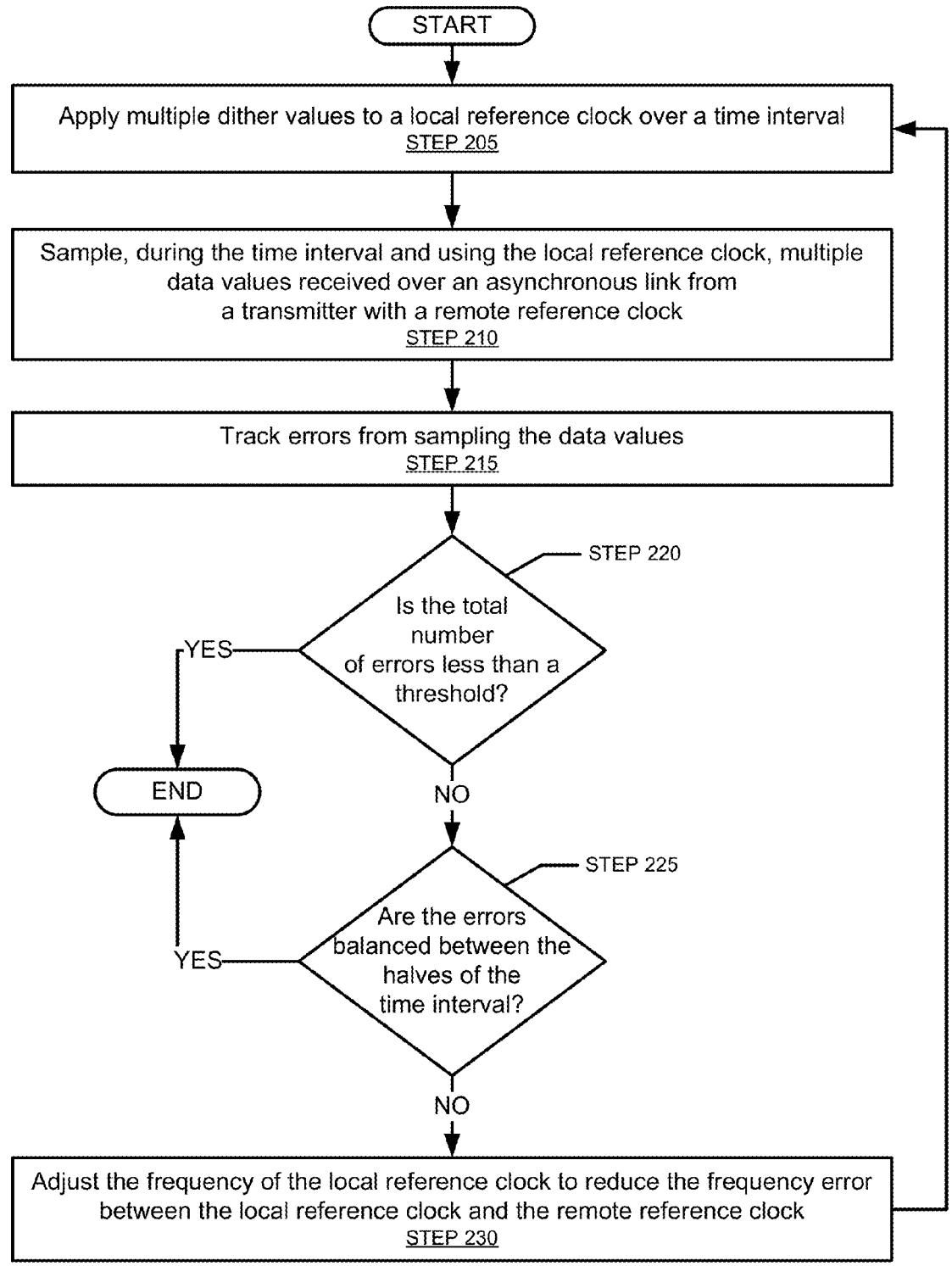
FIG. 2 depicts a flowchart in accordance with one or more embodiments of the invention.

FIG. 2 shows a flowchart in accordance with one or more embodiments. The process depicted in FIG. 2 may be used to reduce a frequency error. Moreover, the process depicted in FIG. 2 may be executed, for example, by one or more components (e.g., EMFC unit (180), CDR unit (164), clock synthesizer IC (150), etc.) discussed above in reference to FIG. 1. One or more steps shown in FIG. 2 may be omitted, repeated, and/or performed in a different order among different embodiments of the invention. Accordingly, embodiments of the invention should not be considered limited to the specific number and arrangement of steps shown in FIG. 2.

Initially, multiple dither values are applied to a local reference clock (STEP 205). The multiple dither values may be applied over a time interval. The dither values are small offsets to the frequency of the local reference clock. In one or more embodiments of the invention, a set of positive dither values are applied during one half of the time interval, while a set of negative dither values are applied to the other half of the time interval. The multiple dither values may range from −1.0 PPM to +1.0 PPM and have a step size of 100 PPB. The local reference clock may be located in a local transceiver that communicates with a remote transceiver having a remote reference clock.

In STEP 210, multiple received data values are sampled during the time interval using the local reference clock. The data values were transmitted by the remote transceiver over an asynchronous link according to the remote reference clock. The line rate (i.e., frequency of the remote reference clock) is recovered from the received data values using the local reference clock. Then, a VFO may be locked to this line rate and used to clock a sampler, which samples the received data values. If there is a significant difference between the line rate and the frequency of the local reference clock (i.e., significant frequency error), the phase noise of the VFO will be degraded. As the VFO derived clock quality degrades, the probability of a bit error increases due to an increased difference between the actual and ideal sampling points of the received data values.

In STEP 215, bit errors from sampling the received data values are tracked. The errors may be detected and reported during forward error correction. Tracking the errors may include counting the total number of errors reported for the time interval. Tracking the errors may also include counting the number of errors for each half of the time interval.

In STEP 220, it is determined whether the total number of counted errors from the time interval is less than a predetermined threshold. When it is determined that the total number of counted errors is less than the predetermined threshold, the process in FIG. 2 may end because the frequency error is sufficiently small that it is not causing a large BER. However, when it is determined that the total number of errors equals or exceeds the threshold, the process may proceed to STEP 225. In one or more embodiments of the invention, STEP 220 is optional. In such embodiments, STEP 225 may immediately follow STEP 215.

In STEP 225, it is determined whether the errors are balanced between the two halves of the time interval. In other words, it is determined whether the same or approximately the same number of errors are observed during both halves of the time interval. In one or more embodiments of the invention, this determination is made by comparing (i.e., a comparison is generated) the error count from the starting half of the time interval with the error count from the ending half of the time interval. When it is determined that the errors are balanced between the two halves of the time interval, the process may end because it is unlikely any additional iterations will further reduce the frequency error. When it is determined that the errors are not balanced, the process proceeds to STEP 230.

In STEP 230, the frequency of the local clock reference is adjusted to reduce the frequency error between the local clock reference and the remote clock reference. STEP 230 may include first determining the sign (+/−) of the frequency error (e.g., by comparing the error count from the starting half with the error count from the ending half), and then determining the direction in which to adjust the frequency of the local reference clock, based on the sign, to reduce the frequency error.

For example, if the error count is smaller for the half time interval during which the negative dither values are being applied, the frequency error is positive, and the frequency of the local reference clock may be slowly decreased (e.g., by 1.0 PPM) to reduce the frequency error. This frequency change may be executed by adjusting the numerator and/or the denominator of the divider(s) in the clock synthesizer IC of the local reference clock.

As another example, if the error count is smaller for the half time interval during which the positive dither values are being applied, the frequency error is negative, and the frequency of the local reference clock may be slowly increased (e.g., by 1.0 PPM) to reduce the frequency error. This frequency change may be executed by adjusting the numerator and/or the denominator of the divider(s) in the clock synthesizer IC of the local reference clock.

Those skilled in the art, having the benefit of this detailed description, will appreciate that the process depicted in FIG. 2 repeats and thus STEP 205 may be visited multiple times. During each visit to STEP 205, the same or different dither values may be applied to the local reference clock. In other words, the applied dither values may change, or take on different forms (e.g., triangle wave vs. sine wave) for each iteration of the process. Similarly, during each visit to STEP 230, the frequency of the local reference clock may be adjusted by the same or different amounts (e.g., 1.0 PPM vs. 0.75 PPM).

Various embodiments may have one or more of the following advantages: the ability to reduce errors from sampling data values by reducing the frequency error between the local reference clock and the remote reference clock; the ability to apply dither values to the local reference clock during a time interval and track errors from sampling the received data values; the ability to compare error counts from different halves of the time interval to identify the sign of the frequency error; the ability to identify a failure of a crystal in a reference clock; etc.

Embodiments of the invention may be implemented on virtually any type of computing system, regardless of the platform being used. For example, the computing system may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory, and input and output device(s) to perform one or more embodiments of the invention.

Figure 5:
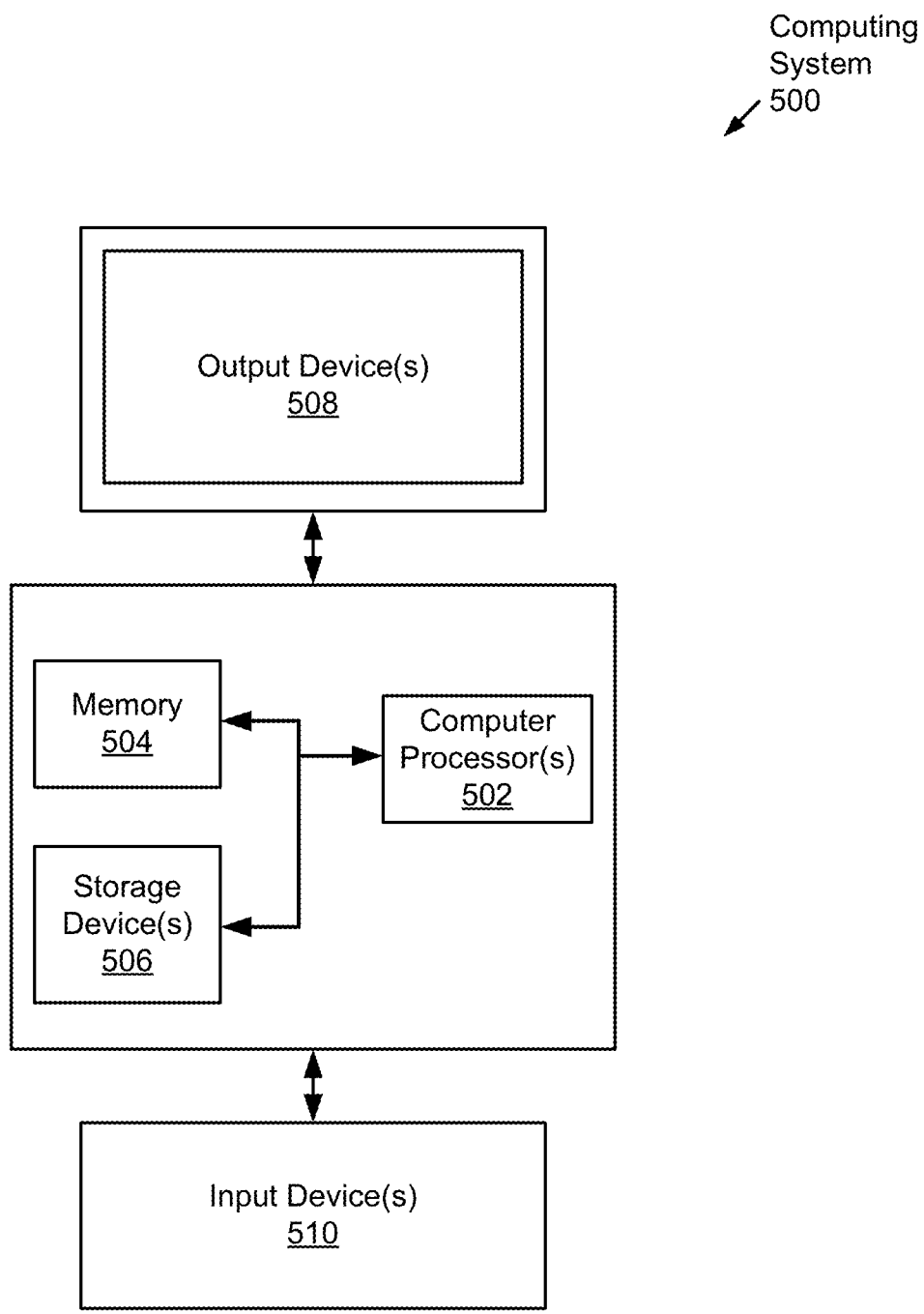
FIG. 5 depicts a computer system in accordance with one or more embodiments of the invention.

For example, as shown in FIG. 5, the computing system (500) may include one or more computer processor(s) (502), associated memory (504) (e.g., random access memory (RAM), cache memory, flash memory, etc.), one or more storage device(s) (506) (e.g., a hard disk, an optical drive such as a compact disk (CD) drive or digital versatile disk (DVD) drive, a flash memory stick, etc.), and numerous other elements and functionalities. The computer processor(s) (502) may be an integrated circuit for processing instructions. For example, the computer processor(s) may be one or more cores, or micro-cores of a processor. The computing system (500) may also include one or more input device(s) (510), such as a touchscreen, keyboard, mouse, microphone, touchpad, electronic pen, or any other type of input device. Further, the computing system (500) may include one or more output device(s) (508), such as a screen (e.g., a liquid crystal display (LCD), a plasma display, touchscreen, cathode ray tube (CRT) monitor, projector, or other display device), a printer, external storage, or any other output device. One or more of the output device(s) may be the same or different from the input device(s). The input and output device(s) may be locally or remotely connected to the computer processor(s) (502), memory (504), and storage device(s) (506). Many different types of computing systems exist, and the aforementioned input and output device(s) may take other forms.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other non-transitory computer readable storage medium. Specifically, the software instructions may correspond to computer readable program code that when executed by a processor(s), is configured to perform embodiments of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for reducing a frequency error, comprising:
   applying a plurality of dither values to a local reference clock over a first time interval by:
   applying, by modifying a divider, a first set of positive dither values during a first half of the first time interval, and
   applying, by modifying the divider, a second set of negative dither values during a second half of the first time interval;
   sampling, during the first time interval and using the local reference clock, a first plurality of data values received over an asynchronous link, wherein the first plurality of data values are transmitted over the asynchronous link based on a remote reference clock;
   tracking a plurality of bit errors from the sampling of the first plurality of data values; and
   adjusting, based on the plurality of bit errors, a frequency of the local reference clock to reduce the frequency error between the local reference clock and the remote reference clock.

2. The method of claim 1, wherein the first set of positive dither values has a maximum dither value of 1.0 parts per million (PPM), wherein two consecutive positive dither values have a step size of 100 parts per billion (PPB), and wherein the plurality of dither values form a triangular wave.

3. The method of claim 1, wherein applying the first set of positive dither values comprises:
   modifying a numerator of the divider in a clock synthesizer integrated circuit of the local reference clock.

4. The method of claim 1, wherein tracking the plurality of bit errors comprises:
   counting a first number of bit errors during the first half of the first time interval;
   counting a second number of bit errors during the second half of the first time interval; and
   generating a comparison by comparing the first number of bit errors with the second number of bit errors,
   wherein the adjusting of the frequency of the local reference clock is based on the comparison.

5. The method of claim 1, further comprising:
   applying, after adjusting the frequency of the local reference clock, the first set of positive dither values to the local reference clock during a first half of a second time interval;
   applying, after adjusting the frequency of the local reference clock, the second set of negative dither values to the local reference clock during a second half of the second time interval;
   sampling, during the second time interval and using the local reference clock, a second plurality of data values received over the asynchronous link, wherein the second plurality of data values are transmitted over the asynchronous link based on the remote reference clock;
   counting a first number of bit errors from the sampling of the second plurality of data values during the first half of the second time interval;
   counting a second number of bit errors from the sampling of the second plurality of data values during the second half; and
   generating a comparison by comparing the first number of bit errors with the second number of bit errors,
   wherein the comparison indicates that the first number of bit errors and the second number of bit errors are balanced.

6. The method of claim 1, further comprising:
   issuing, by a first line module comprising the local reference clock, an alert based on repeated adjustments to the local reference clock, wherein the remote reference clock is located in a switch module connected to the first line module and a second line module, and
   wherein failure of a crystal in the local reference clock is detected based on the alert from the first line module and no alert from the second line module.

7. The method of claim 1, further comprising:
   issuing, by a first line module comprising the local reference clock, a first alert based on repeated adjustments to the local reference clock, wherein the remote reference clock is located in a switch module connected to the first line module and a second line module, wherein the second line module issues a second alert, and
   wherein failure of a crystal in the remote reference clock is detected based on the first alert and the second alert.

8. A non-transitory computer readable medium (CRM) comprising instructions stored thereon for reducing a frequency error, the instructions when executed by a processor causes the processor to:
   apply a plurality of dither values to a local reference clock over a first time interval by:
   applying, by modifying a divider, a first set of positive dither values during a first half of the first time interval, and
   applying, by modifying the divider, a second set of negative dither values during a second half of the first time interval;
   track a plurality of bit errors from sampling a first plurality of data values received over an asynchronous link, wherein the first plurality of data values are sampled during the first time interval using the local clock reference, and wherein the first plurality of data values are transmitted over the asynchronous link based on a remote reference clock; and adjust, based on the plurality of bit errors, a frequency of the local reference clock to reduce the frequency error between the local reference clock and the remote reference clock.

9. The non-transitory CRM of claim 8, wherein the first set of positive dither values has a maximum dither value of 1.0 parts per million (PPM), and wherein two consecutive positive dither values have a step size of 100 parts per billion (PPB).

10. The non-transitory CRM of claim 8, wherein the application of the first set of positive dither values comprises:
modifying a numerator in the divider in a clock synthesizer integrated circuit of the local reference clock.

11. The non-transitory CRM of claim 8, wherein the tracking of the plurality of bit errors comprises:
counting a first number of bit errors during the first half of the first time interval;
counting a second number of bit errors during the second half of the first time interval; and
generating a comparison by comparing the first number of bit errors with the second number of bit errors,
wherein the adjusting of the frequency of the local reference clock is based on the comparison.

12. The non-transitory CRM of claim 8, further comprising instructions when executed by the processor causes the processor to:
apply, after adjusting the frequency of the local reference clock, the first set of positive dither values to the local reference clock during a first half of a second time interval;
apply, after adjusting the local reference clock, the second set of negative dither values to the local reference clock during a second half of the second time interval;
sample, during the second time interval and using the local reference clock, a second plurality of data values received over the asynchronous link, wherein the second plurality of data values are transmitted over the asynchronous link based on the remote reference clock;
count a first number of bit errors from the sampling of the second plurality of data values during the first half of the second time interval;
count a second number of bit errors from the sampling of the second plurality of data values during the second half; and
generate a comparison by comparing the first number of bit errors with the second number of bit errors,
wherein the comparison indicates that the first number of bit errors and the second number of bit errors are balanced.

13. A system for reducing a frequency error, comprising:
a local reference clock comprising a divider;
a clock and data recovery (CDR) circuit configured to sample, using the local reference clock, a plurality of data values during a first time interval, wherein the first plurality of data values are received over an asynchronous link, and wherein the first plurality of data values are transmitted over the asynchronous link based on a remote reference clock; and
an error monitoring and frequency control (EMFC) circuit configured to:
apply a plurality of dither values to the local reference clock over the first time interval by:
applying, by modifying the divider, a first set of positive dither values during a first half of the first time interval, and
applying, by modifying the divider, a second set of negative dither values during a second half of the first time interval,
track a plurality of bit errors from the sampling of the first plurality of data values, and
adjust, based on the plurality of bit errors, a frequency of the local reference clock to reduce the frequency error between the local reference clock and the remote reference clock.

14. The system of claim 13, further comprising:
a forward error correction (FEC) circuit connected to both the CDR circuit and the EMFC circuit and configured to detect the plurality of bit errors.

15. The system of claim 14, wherein:
the local reference clock comprises a clock synthesizer integrated circuit comprising the divider; and
the EMFC circuit applies the plurality of dither values by modifying a numerator of the divider.

16. The system of claim 15, wherein:
the tracking of the plurality of bit errors comprises:
counting a first number of bit errors during the first half, counting a second number of bit errors during the second half, and generating a comparison by comparing the first number of bit errors with the second number of bit errors,
wherein adjusting the frequency of the local reference clock is based on the comparison.

17. The system of claim 13, wherein the local reference clock, the CDR circuit, and the EMFC circuit are located in a first line module of a telecommunications system, and wherein the remote reference clock is located in a switch module of the telecommunications system connected to the first line module and a second line module.

18. The system of claim 17, wherein:
the first line module issues a first alert based on repeated adjustments to the local reference clock,
the second line module issues a second alert, and
failure of a crystal in the remote reference clock is detected based on the first alert and the second alert.

* * * * *